United States Patent
Rissing et al.

(10) Patent No.: US 6,815,263 B2
(45) Date of Patent: Nov. 9, 2004

(54) COMPONENT ASSEMBLY AND METHOD FOR PRODUCING THE SAME

(75) Inventors: Lutz Rissing, Seebruck (DE); Florian Obermayer, Waging am See (DE)

(73) Assignee: Dr. Johannes Heidenhain GmbH, Traunreut (DE)

(*) Notice: Subject to any disclaimer, the term of this patent is extended or adjusted under 35 U.S.C. 154(b) by 0 days.

(21) Appl. No.: 10/276,607

(22) PCT Filed: May 5, 2001

(86) PCT No.: PCT/EP01/05107
§ 371 (c)(1),
(2), (4) Date: Nov. 15, 2002

(87) PCT Pub. No.: WO01/88978
PCT Pub. Date: Nov. 22, 2001

(65) Prior Publication Data
US 2003/0173655 A1 Sep. 18, 2003

(30) Foreign Application Priority Data
May 17, 2000 (DE) .......................... 100 24 336

(51) Int. Cl.⁷ .................... H01L 21/44; H01L 21/48; H01L 21/50
(52) U.S. Cl. ............. 438/127; 438/106; 438/107; 438/124; 438/126
(58) Field of Search ................ 438/106, 107, 438/111, 122, 112, 124, 125, 126, 127; 257/787, 789

(56) References Cited

U.S. PATENT DOCUMENTS

| 5,264,393 A | 11/1993 | Tamura et al. |
| 5,861,680 A | 1/1999 | Yamanaka |
| 5,867,368 A * | 2/1999 | Glenn .................. 361/783 |

FOREIGN PATENT DOCUMENTS

| DE | 44 08 176 | 9/1995 |
| DE | 44 46 566 | 6/1996 |
| DE | 195 30 878 | 2/1997 |
| DE | 196 23 826 | 12/1997 |
| DE | 197 28 992 | 1/1999 |
| GB | 2 334 375 | 8/1999 |
| JP | 61-101067 | 10/1984 |
| JP | 61-101054 | 5/1986 |
| JP | 63-137460 | 6/1988 |

OTHER PUBLICATIONS

Patent Abstracts of Japan vol. 012, No. 397 (E–672), Oct. 21, 1988.

* cited by examiner

Primary Examiner—Maria Guerrero
(74) Attorney, Agent, or Firm—Kenyon & Kenyon

(57) ABSTRACT

In a component assembly and method for producing the same, the component assembly includes at least one component arranged on a support subframe, e.g., a printed circuit board. An insulator enclosing the component and including two isolating superimposed layers is also arranged on the support substrate. A sealing mass covering the component is arranged inside the insulator. The two or more isolating layers are made from the same isolating material and connected at the contact area.

20 Claims, 4 Drawing Sheets

COMPONENT ASSEMBLY AND METHOD FOR PRODUCING THE SAME

FIELD OF THE INVENTION

The present invention relates to a component assembly as well as to a method for producing a component assembly.

BACKGROUND INFORMATION

Electronic and/or optoelectronic components may be placed on carrier substrates, such as circuit boards in several ways. It is customary, for instance, for unhoused components to be initially placed on the circuit board at a designated location and subsequently electrically contacted, for example by wire bonding. An injection needle or a so-called dispenser is subsequently used to position an enclosed dam on the circuit board to surround the component. Finally, in a further process step, a suitable encapsulating material is introduced into the well-shaped inner region of the dam, so that the component and any existing bonding wires, etc., are covered by the encapsulated material and protected from environmental influences. In connection with component assemblies of this kind, reference is made, for example, to German Published Patent Application No. 195 30 878 and Japanese Published Patent Application No. 61-101054. From both documents it can be inferred, that the dam has two dam layers.

A number of problems arise in the context of high component densities, as well as with regard to the use of electronic components. Thus, in component assemblies of this kind, a smallest possible base area must be ensured for the dam on the particular carrier substrate, in order not to needlessly cover essential space on the carrier substrate. A two-part dam structure discussed in German Published Patent Application No. 195 30 878 requires, for example, a relatively large base area for the dam on the carrier substrate, and therefore, does not fulfill this requirement.

In addition, the use of optoelectronic components requires that the encapsulating material placed over this component have, to the extent possible, no undesired optical effect for the beam of rays passing through. This is also not ensured in the case of German Published Patent Application No. 195 30 878, since the beam of rays passing through is deflected at the curved boundary surface between the encapsulating material and the ambient air due to the resulting lens effect.

It is also to be noted in connection with the assembly described in Japanese Published Patent Application No. 61-101054 that the two dam layers having different melting points require considerable costs for process control due to the different processing temperatures. Expenses are also entailed in terms of process technology, due to the necessity to process a plurality of dam materials in the manufacturing of such an assembly.

SUMMARY

An object of the present invention is, therefore, to provide a method for the manufacture of a component assembly which satisfy the specific requirements. In particular, besides a greatest possible component density and adequate mechanical stability, an object of the present invention is to also ensure the usability of optoelectronic components. Also desirable is a simplest possible manufacturing of a component assembly of this kind.

This objective is achieved by providing a method as described herein.

The measures in accordance with the present invention may ensure that a stable bond forms in the contact region between adjacent dam layers. When a suitable dam material is used, there is a stable cross-linking of the two adjacent dam layers in this region. The stable bond in this region results in a mechanically more resistant overall assembly. It is thereby possible to form high dams having a comparatively small dam surface area, i.e., high component densities are also able to be ultimately realized in accordance with the present invention. Due to the possible high dam structure, the inner region of the dam may be filled with a suitable encapsulating material such that this material has a virtually ideal, plane surface area. No undesired, optically deflecting action results at the boundary surface with the ambient air for the beam of rays passing through. As discussed above, this may be an essential requirement when optoelectronic components are to be used in assemblies of this kind.

The use of the identical dam material in all dam layers also signifies that all dam layers have the same thermal expansion coefficient. Therefore, no thermally induced stresses may occur between the various dam layers in the dam.

Also, from a standpoint of production engineering, a number of advantages may be derived from the measures according to the present invention. Thus, in contrast to the above-mentioned Japanese Published Patent Application No. 61-101054, the need is eliminated to keep different materials available for the minimum of two dam layers, since the at least two dam layers are made of the same material. In addition, in the various process steps in which the various dam layers are applied, there is no longer a need to have different temperatures due to different melting points or processing temperatures.

Due to the use of the same material in the dam layers, a stable bond may be ensured. Thus, for instance, when using suitable material, a chemical cross-linking results in the contact region upon final curing. The result is a high mechanical load-bearing capacity of the dam.

DETAILED DESCRIPTION

Figure 1:
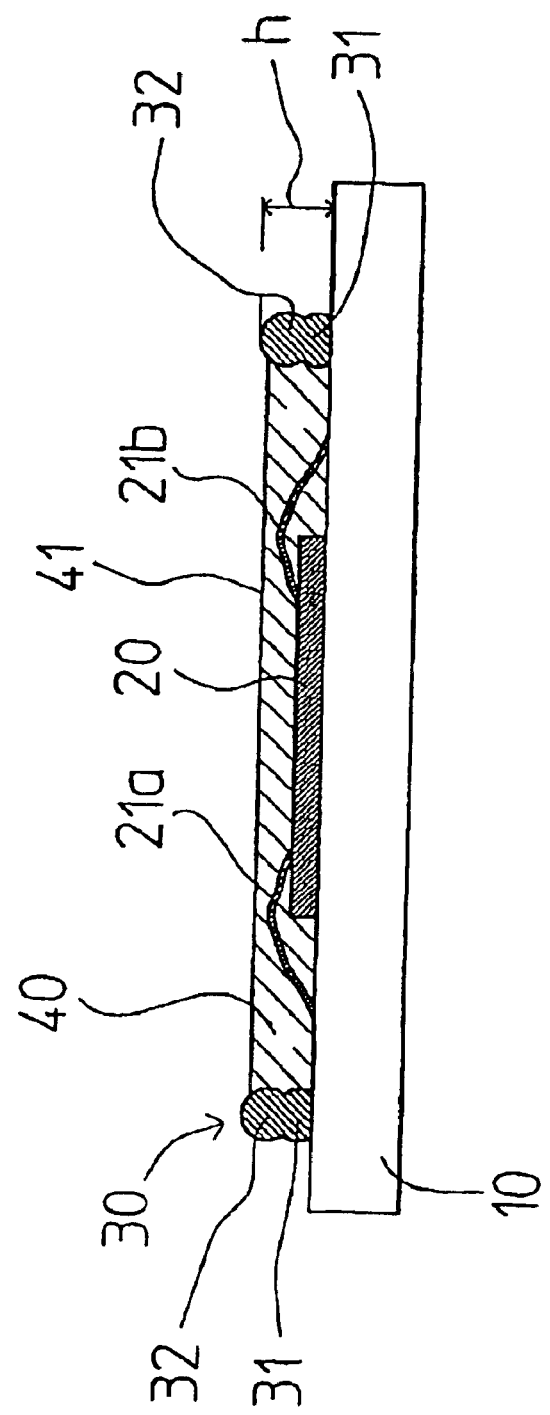
FIG. 1 is a lateral cross-sectional view of an exemplary embodiment of the component assembly according to the present invention.

In schematic form, FIG. 1 is a cross-sectional view of an example embodiment of the component assembly according to the present invention. For example, the depicted view may be a detail of a carrier substrate 10 configured as a circuit board, upon which other component assemblies of this kind are also provided.

In the illustrated exemplary embodiment, carrier substrate 10 is designed as a circuit board and functions as a carrier element for the component assembly. As a suitable material for carrier substrate 10, conventional circuit-board material is provided, such as FR4 or FR5. Alternatively hereto, a differently configured carrier substrate 10 may also be used, such as suitable ceramic, e.g., $Al_2O_3$. Electrical conductor tracks may extend in the carrier substrate 10 as an example. They may be used for the contacting of the unhoused electronic component 20, as well as of the other components on circuit board 10. The present example embodiment provides for a contacting of component 20 using bonding wires 21a, 21b. Bonding wires 21a, 21b electroconductively connect component 20 to the conductor tracks in carrier substrate 10. An alternative and/or additional electrical contacting of component 20 may be possible, such as a so-called narrow-ribbon contacting, or also the use of soldered connectors.

In this example embodiment, component 20 is designed as an optoelectronic component or as a so-called OPTO-ASIC. In addition to optoelectronic components, such as photodiodes, it includes other electronic components for signal processing. The present invention may also be implemented in conjunction with conventional electronic components, such as ASICs, etc.

The particular component 20 is placed on carrier substrate 10, which may be done by bonding to carrier substrate 10. Soldering or alloying is also alternatively possible. The present invention may be suited in this case for assembling unhoused electronic and/or optoelectronic components on circuit boards, i.e., components which do not have their own housing and, accordingly, offer a particularly space-saving design.

Furthermore, the component assembly according to the present invention includes a dam 30, which is placed on carrier substrate 10 and surrounds or encircles the particular component 20. From the plan view of the component assembly illustrated in FIG. 2, dam 30 surrounds component 20 quadratically. Alternative geometries are also possible with respect to the shape of surrounding dam 30, e.g., rectangular, polygonal, or round dam profiles, etc.

A first function of dam 30, with respect to the component assembly according to the present invention, is to form a boundary of the surface required for embedding component 20 using an encapsulating compound 40 on carrier substrate 10. Once dam 30 is created, encapsulating compound 40 is introduced into the well-shaped inner region of surrounding dam 30. The purpose of embedding using encapsulating compound 40 is to protect component 20 from mechanical influences. In this connection, because of optoelectronic component 20, a transparent and low-viscosity encapsulating compound 40, such as unfilled epoxy resin, is used in the described exemplary embodiment. In the inner region of dam 30, encapsulating compound 40 covers component 20, including bonding wires 21a, 21b, so that, once encapsulating compound 40 is cured, these elements are reliably protected. To fulfill this purpose, encapsulating compound 40 may completely cover the elements to be protected, i.e., in this example embodiment, also bonding wires 21a, 21b in particular, for which a specific level of encapsulating compound 40 to be applied, may be required. Since this compound, when applied using an injection needle, is not yet cured and flows out, dam 30 ultimately is used to adjust the necessary level of encapsulating compound 40, without covering unnecessary surface area on carrier substrate 20.

Alternatively to the illustrated exemplary embodiment, bonding wires 21a, 21b may not be fully covered with encapsulating compound 40, rather, for the most part, merely surrounded by the same.

When no optoelectronic components are provided in the component assembly according to the present invention, a non-transparent encapsulating compound 40 may also be used. A black encapsulating compound 40 may be used which protects the particular electronic component 20 from unwanted irradiation.

The component may be covered using encapsulating compound, for example when contacting using bonding wires are not provided and, accordingly, there would also be no bonding wires to protect.

Another function of dam 30, specifically when using optoelectronic components, is that, virtually ideal plane boundary surfaces are able to be ensured, between encapsulating compound 40 and the neighboring air. The result is that there is no undesired deflection of incident or, as the case may be, emergent beams of rays at this boundary surface 41.

Dam 30 enables a defined, i.e., reproducible height h of the component assembly to be reliably set over carrier substrate 10 in the course of manufacturing. This may be especially significant when an assembly of this type is used, for example, under narrowed, spatial conditions. If, for instance, a component assembly of this type is used on the scanning plate of an optical position transducer disposed oppositely to a rotating partial disk, a relatively small distance is provided between the scanning plate and the partial disk in compact systems. On no account, then, may any accessories mounted on the side of the scanning plate exceed a specific, predefined height.

In the illustrated exemplary embodiment of the present invention, dam 30 is composed of two dam layers 31, 32, which are placed one over the other and are made of the same dam material. There is a bonding between the two adjoining dam layers 31, 32, in their contact region. Alternatively to a configuration including two dam layers 31, 32, a dam configuration may also be provided which includes more than two such dam layers 31, 32, each of the same dam material, if an even greater height h of dam 30 were necessary.

A highly viscous encapsulating compound, such as filled epoxy resin or a silicon, is a suitable dam material, for example. Within the scope of the present invention, a dam material for the various layers 31, 32 of dam 30 is selected, which allows a cross-linking of the same and, thus, a stable bonding in the contact region of adjoining dam layers 31, 32.

In the case of other dam materials, a mechanical engagement of the rough surfaces of the dam layers may be present in this contact region, for example. Depending on the material selection, other connection mechanisms may be optionally present in the contact region between the dam layers.

By constructing dam 30 out of two or more dam layers 31, 32 from the same dam material, in accordance with the present invention, a defined adjustment of the desired ratio V of dam height h and dam width b (V=h/b) is able to be made. By applying measures described below, width b of dam 30 is set in defined fashion, without any undesired flowing of the dam material and, thus, unwanted enlargement of the required carrier substrate surface taking place. By subsequently applying one or more further dam layers 32 to first dam layer 31, the requisite dam height h is then able to be set in definable, i.e., reproducible fashion. The ratio V=h/b may be in the range of 0.5<V<1 as an example. However, on the basis of an appropriate process control, other ratios V may also be fundamentally adjusted.

Typical values for resulting dam height h and dam width b are h=0.8 mm and b=1.0 mm.

Figure 3:
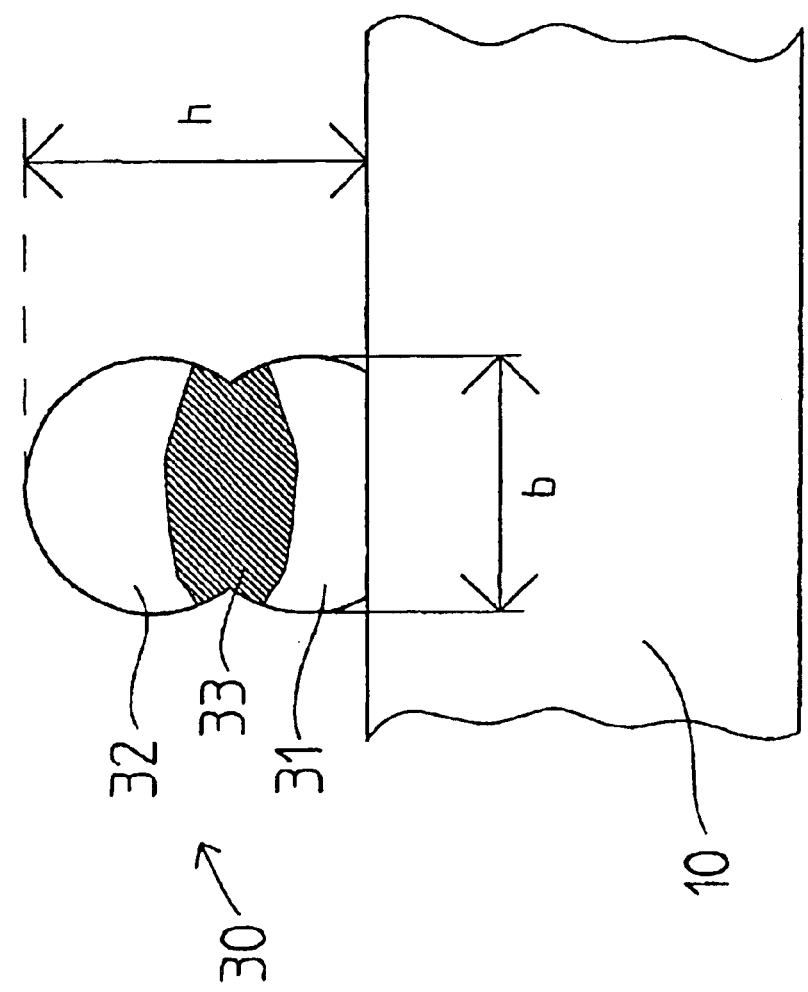
FIG. 3 is an enlarged view of the dam illustrated in FIG. 1.

FIG. 3 is an enlarged view of dam 30 of FIG. 1, which includes the two dam layers 31, 32. Besides the geometric dimensions, dam height h and dam width b, FIG. 3 also illustrates contact region 33 adjoining dam layers 31, 32, where there is a cross-linking of the two dam layers 31, 32 and, thus, a stable bonding of the same.

Figure 2:
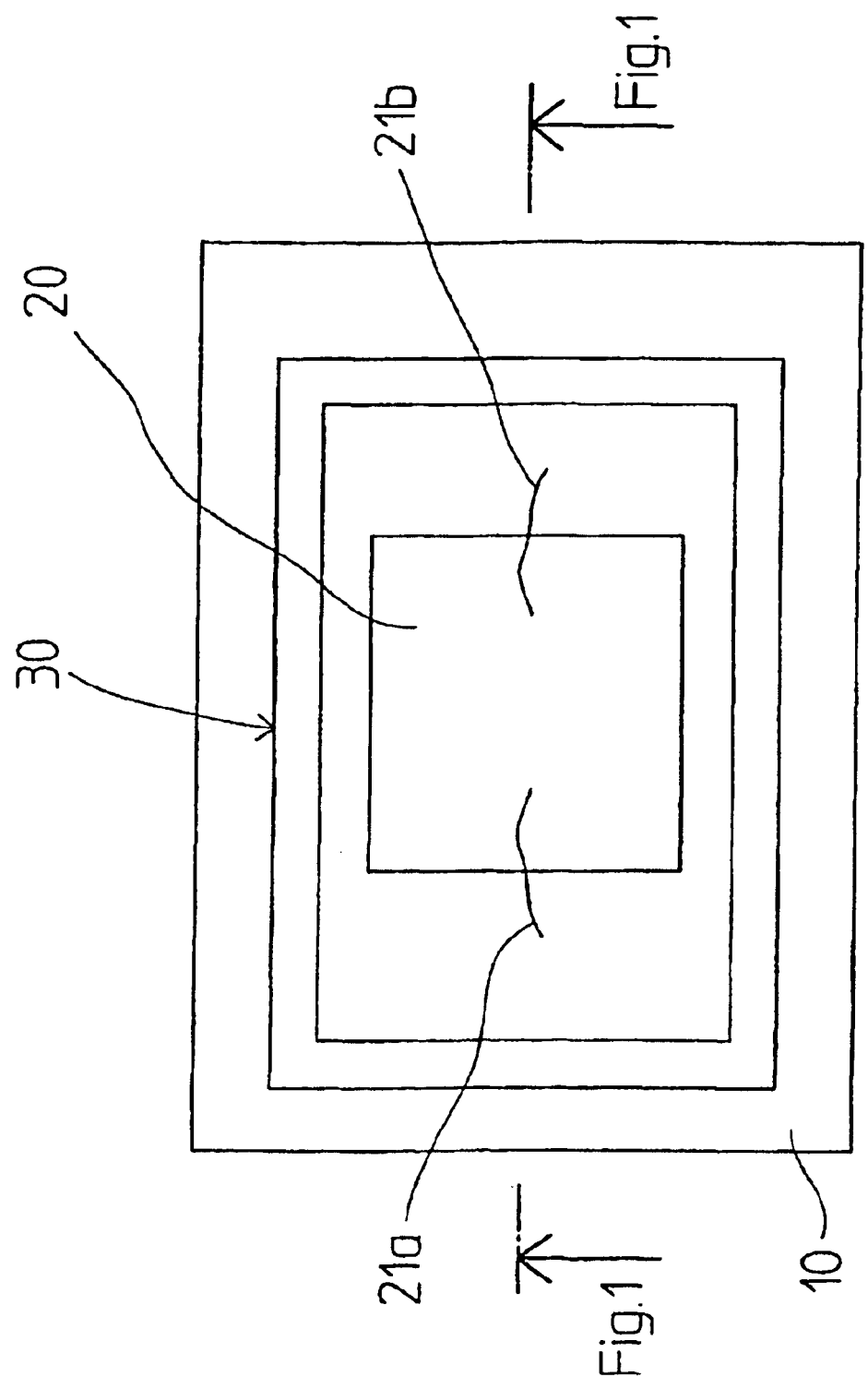
FIG. 2 is a plan view of the component assembly illustrated in FIG. 1.

As illustrated in FIGS. 4a–4d, one example embodiment of the method according to the present invention is presented for manufacturing a component assembly as described in FIGS. 1–3.

Figure 4A:
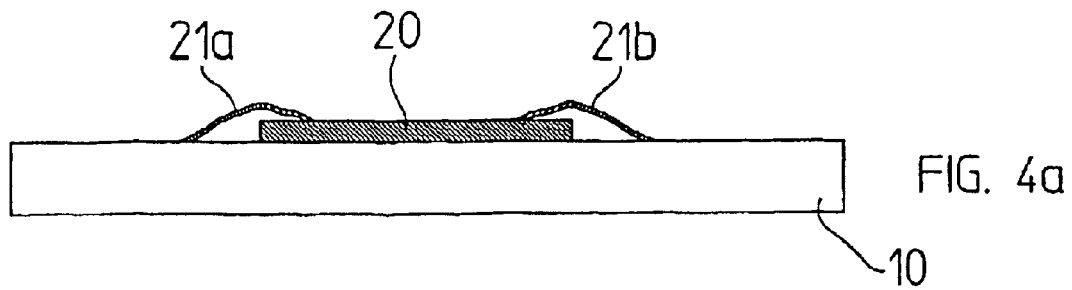
FIGS. 4a–4d illustrate various process steps of one example embodiment of the method according to the present invention.

In a first process step illustrated in FIG. 4a, unhoused component 20 is placed on carrier substrate 10 or the circuit board and, if indicated, bonded thereto. Component 20 is then electrically contacted, which may take place via wire bonding and the placement of corresponding bonding wires 21a, 21b.

First dam layer 31 is subsequently applied to carrier substrate 10, which, as explained above, completely surrounds component 20.

Figure 4B:
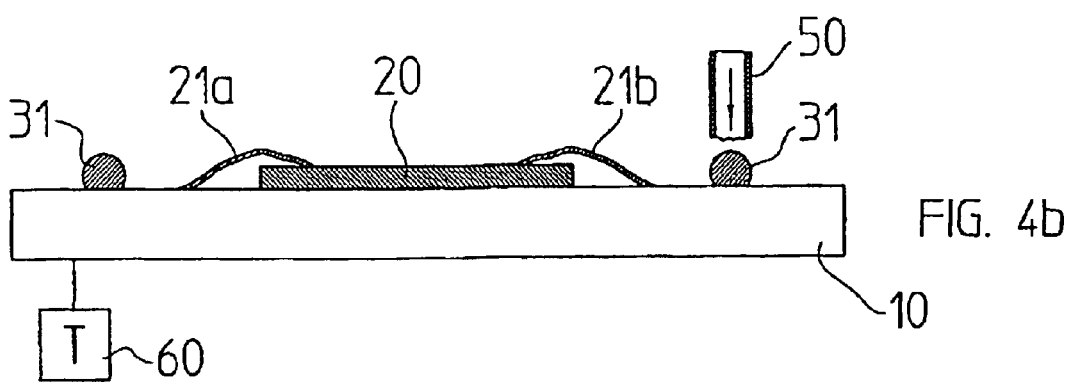

The corresponding process step is illustrated in FIG. 4b. The appropriate dam material is applied by a schematically indicated injection needle 50 using so-called dispensing technology. During application of first dam layer 31, carrier substrate 10 is heated to temperature T, which is illustrated by schematically indicated heating device 60. The heating of the circuit board or, if indicated, of an alternative carrier substrate 10 effects a precuring of the dam material of first dam layer 31, immediately upon making contact on carrier substrate 10. This makes it possible to prevent first dam layer 31 from flowing in unwanted fashion, and from consuming surface area. It is, therefore, possible to adjust desired dam width b in a defined manner. The desired width or height of first dam layer 31 is able to be set in a defined manner by adjusting the traversing rate of injection needle 50, the applied quantity of the dam material, as well as temperature T of carrier substrate 10.

Figure 4C:
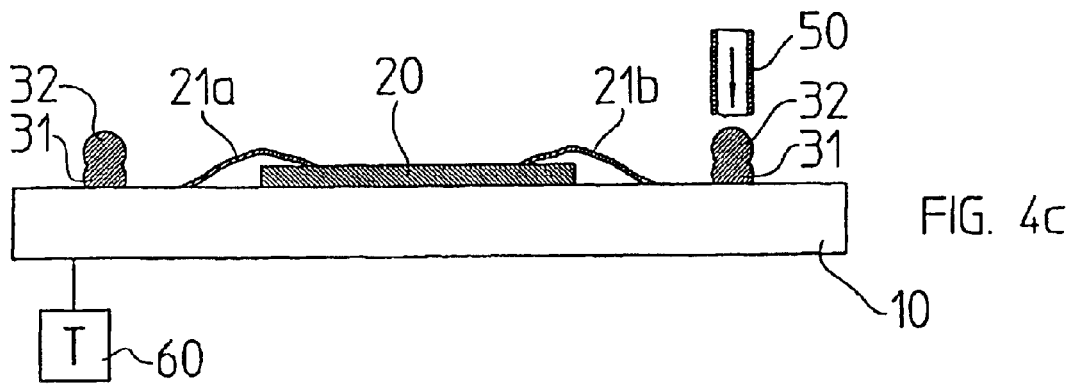

Still during the curing of first dam layer 31, second dam layer 32 is subsequently applied, as illustrated in FIG. 4c, with the aid of injection needle 50. As explained above, for second dam layer 32, the same dam material as for first dam layer 31 is used. Since a complete curing has not taken place in the top part of first dam layer 31, following application of second dam layer 32 in the contact region, a cross-linking of the two dam layers 31, 32 occurs, i.e., an especially intimate and, thus, stable bond is formed between adjoining dam layers 31, 32.

Figure 4D:
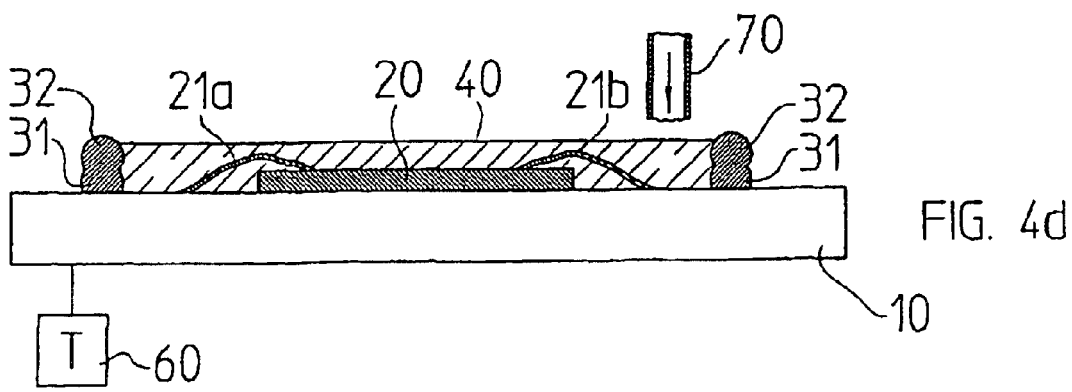

Subsequently, i.e., after curing of the two dam layers 31, 32, as illustrated in FIG. 4d, encapsulating compound 40 is introduced into the well-shaped inner region of dam 30, which is accomplished using an injection needle 70. For this, it is customary in the corresponding device to use a different injection needle 60 than the one used in the preceding process steps. In this connection, the amount of encapsulating compound 40 introduced is enough to fill the inner region of the dam nearly to the upper edge of dam 30, i.e., to the upper edge of top-most dam layer 32. Upon curing of encapsulating compound 40, the result is a component assembly which is protected from mechanical influences.

Alternatively, it may also be provided to begin introducing encapsulating compound 40, immediately following the application of last dam layer 32.

Within the framework of the present invention, there are alternative variants in addition to the described example embodiments.

What is claimed is:

1. A method for manufacturing a component assembly on a carrier substrate following placement of a component on the carrier substrate, comprising:

applying an enclosed dam including two superposed dam layers to the carrier substrate surrounding the component, including:

initially applying a first dam layer of a dam material;

subsequently applying a second dam layer of identical dam material over the first dam layer, in a contact region of the two dam layers, a bonding resulting between the first dam layer and the second dam layer; and during the applying of the first dam layer, heating the carrier substrate effecting a precuring of the dam material of the first dam layer immediately when contact is made on the carrier substrate.

2. The method according to claim 1, wherein the condition 0.5<h/b<1 is satisfied, b representing a dam width and h representing a dam height.

3. The method according to claim 1, wherein the bonding between the first dam layer and the second dam layer includes cross-linking of the first dam layer and the second dam layer.

4. The method according to claim 1, wherein the dam material includes a filled epoxy resin.

5. The method according to claim 1, wherein the component includes an optoelectronic component.

6. The method according to claim 1, wherein the carrier substrate includes a circuit board.

7. The method according to claim 1, wherein the second dam layer is applied in the second dam layer applying step as soon as the first dam layer begins to cure in an area of the carrier substrate but is not yet fully cured in the contact region of the dam layers.

8. The method according to claim 1, further comprising electroconductively connecting the component to conductor tracks in the carrier substrate prior to the applying step.

9. The method according to claim 1, further comprising introducing an encapsulating compound in an inner region of the dam to cover the component subsequent to a curing of the applied dam layers.

10. The method according to claim 1, further comprising introducing an encapsulating compound in an inner region of the dam to cover the component subsequent to the application of the second dam layer.

11. The method according to claim 1, further comprising introducing a quantity of encapsulating compound into an inner region of the dam to fill the dam nearly to an upper edge of the dam.

12. The method according to claim 1, further comprising introducing a quantity of encapsulating compound into an inner region of the dam to fill the dam to an upper edge of a top-most dam layer.

13. The method according to claim 7, wherein the dam layers are applied in the applying step using an injection needle.

14. The method according to in claim 13, further comprising adjusting at least one of a traversing rate of the injection needle, an applied quantity of the dam material, and a temperature of the carrier substrate to one another to set a height and a width of the dam layers.

15. The method according to claim 8, wherein the component is electroconductively connected in the connecting step by bonding wires to the conductor tracks in the carrier substrate.

16. The method according to claim 9, wherein the encapsulating compound is transparent.

17. The method according to claim 10, wherein the encapsulating compound is transparent.

18. The method according to claim 11, wherein the encapsulating compound is transparent.

19. The method according to claim 12, wherein the encapsulating compound is transparent.

20. A device for manufacturing a component assembly on a carrier substrate following placement of a component on the carrier substrate, comprising:

- a device configured to apply an enclosed dam including two superposed dam layers to the carrier substrate surrounding the component, including:
    - an arrangement configured to initially apply a first dam layer of a dam material;
    - an arrangement configured to subsequently apply a second dam layer of identical dam material over the first dam layer, in a contact region of the two dam layers, a bonding resulting between the first dam layer and the second dam layer; and
- an arrangement configured to heat the carrier substrate, during application of the first dam layer, to effect a precure of the dam material of the first dam layer immediately when contact is made on the carrier substrate.

* * * * *